United States Patent [19]

Young et al.

[11] Patent Number: 5,341,009
[45] Date of Patent: Aug. 23, 1994

[54] FAST CHARGING MOS CAPACITOR STRUCTURE FOR HIGH MAGNITUDE VOLTAGE OF EITHER POSITIVE OR NEGATIVE POLARITY

[75] Inventors: Dennis C. Young, Melbourne; Rex E. Lowther, Palm Bay, both of Fla.

[73] Assignee: Harris Corporation, Melbourne, Fla.

[21] Appl. No.: 90,978

[22] Filed: Jul. 9, 1993

[51] Int. Cl.$^5$ .................. H01L 27/02; H01G 1/005
[52] U.S. Cl. .................. 257/296; 257/313; 257/532; 257/535; 361/303
[58] Field of Search ............ 257/296, 313, 532, 535; 361/303

[56] References Cited

U.S. PATENT DOCUMENTS 5,083,184 1/1992 Eguchi .................. 257/532

*Primary Examiner*—Edward Wojciechowicz
*Attorney, Agent, or Firm*—Charles E. Wands

[57] ABSTRACT

Depletion layer depth and semiconductor real estate occupation area shortcomings of conventional MOS capacitor architectures that are formed on lightly doped semiconductor material are obviated by augmenting the MOS capacitor structure with a pair of opposite conductivity type, high impurity concentration regions, both of which are directly contiguous with the lightly doped lower plate layer that underlies the capacitor's dielectric layer, and connecting both of these auxiliary heavily doped regions to a common capacitor electrode terminal for the lower plate of the capacitor. If a high negative charge is applied to the upper plate overlying the thin dielectric layer, holes are readily supplied by the auxiliary P+ region. Conversely, if a high positive charge be applied to the upper plate, electrons are readily supplied by the auxiliary N+ region. By connecting both the auxiliary N+ and P+ regions together, a deep depletion condition is prevented for either polarity of the applied voltage. An application of the MOS capacitor structure is its use in a single event upset immune memory cell formed on an insulating substrate. A pair of MOS capacitors having a structural configuration in accordance with the present invention are coupled between input and output nodes of a pair of cross-coupled MOSFET inverters that form the memory cell.

32 Claims, 2 Drawing Sheets

FAST CHARGING MOS CAPACITOR STRUCTURE FOR HIGH MAGNITUDE VOLTAGE OF EITHER POSITIVE OR NEGATIVE POLARITY

FIELD OF THE INVENTION

The present invention relates in general to integrated circuit architectures and is particularly directed to a new and improved MOS capacitor structure formed of a lightly doped semiconductor layer and having a very fast charging time for voltages of both positive and negative polarities.

BACKGROUND OF THE INVENTION

There are a number of integrated circuit architectures which require a capacitor having a very short charging time (e.g. on the order of a nanosecond or less). It is also desirable that the capacitor have as high a value as possible under a bias voltage of either polarity. For this purpose, an MOS capacitor may be formed at a surface portion of a silicon-on-insulator (e.g. silicon-on-sapphire (SOS)) structure, in which a surface insulator (e.g. oxide layer) forms the capacitor dielectric between a topside plate (e.g. doped polysilicon or metal) layer and an underlying plate layer (e.g. a doped silicon region).

In many silicon-on-sapphire processes having a (epitaxial) silicon layer formed atop a sapphire support structure, it is possible to dope the epitaxial silicon layer at a sufficiently high impurity concentration, such that the depth of any depletion region formed in the silicon layer underlying the surface dielectric (oxide) is small relative to the thickness of the surface oxide. The capacitance of the resulting MOS capacitor structure is near its maximum attainable value under all bias conditions and the charging time is extremely small.

Some manufacturing processes, however, do not readily accommodate doping that portion of the semiconductor layer underlying the thin oxide at a high impurity concentration, so that the lower plate of an MOS capacitor must be formed by way of a lightly doped region. In such a capacitor structure, the lightly doped region will go into a deep depletion condition in response to the application of a high charge of a polarity corresponding to that of the doped material (high negative charge for a lightly doped N-semiconductor layer and high positive charge for a lightly doped P− semiconductor layer). For such a lightly doped structure, the depletion depth is typically an order of magnitude greater than the oxide thickness, which significantly reduces the transient capacitance.

One possible solution to such a deep depletion recovery problem would be to incorporate two such capacitors into the circuit and connect the capacitors in parallel, one capacitor having lightly doped N− material, contiguous with a more heavily doped N+ contact region, and another capacitor having lightly doped P− material, that is contiguous with a more heavily doped P+ contact region. Such a circuit configuration would ensure that the total capacitance of the capacitor pair is never below the dielectric (oxide) capacitance of either capacitor. Unfortunately, providing a pair of such capacitors means that the amount of semiconductor real estate used to form a single capacitor must be doubled for the two capacitor case.

SUMMARY OF THE INVENTION

In accordance with the present invention, the above described depletion layer depth and semiconductor real estate occupation area shortcomings of conventional MOS capacitor architectures formed on lightly doped semiconductor material are solved by augmenting the conventional MOS capacitor structure with a pair of auxiliary, opposite conductivity type, (P+ and N+) high impurity concentration regions, both of which are directly contiguous with the lightly doped, lower plate-forming, semiconductor layer that underlies the capacitor's dielectric layer, and connecting both of these auxiliary heavily doped regions to a common capacitor electrode terminal for the lower plate of the capacitor.

If a high negative charge is applied to the upper plate (gate electrode) overlying the thin dielectric layer, holes are readily supplied by the auxiliary P+ region. If a high positive charge is applied to the upper plate, electrons are readily supplied by the auxiliary N+ region. Namely, by connecting both the auxiliary N+ and P+ regions together, a deep depletion condition is prevented for either polarity of the applied voltage. Moreover, since both P+ and N+ contacts are tied together, the tendency of an inversion layer to float (as occurs in a standard MOS capacitor, because the deep depletion layer forms a barrier between the inversion layer and a contact) is prevented. Also, the time required to charge the MOS capacitor is limited only by the mobility of the carriers in the semiconductor layer.

A particularly useful application of the improved MOS capacitor structure according to the present invention is in a single event upset (SEU) immune memory cell formed on an insulating substrate (e.g. sapphire or oxide) using CMOS technology. In such a circuit structure, a pair of the MOS capacitors of the present invention are employed. Each capacitor is coupled between the input and output nodes of a respective one of the inverters of a cross-coupled inverter pair of which the memory is formed. Should a high energy particle pass through the channel region of an off transistor of one of the inverters, a large amount of charge is rapidly generated. Most of the charge is accumulated and swept across the 'OFF' MOS transistor's depletion region, which tends to change the voltage at the output of the inverter that has been hit by the particle. This voltage can change sufficiently to cause the other inverter of the cross-coupled inverter pair to switch, thus altering the state of the memory cell.

One technique to minimize the effect of the particle hit is to add capacitance to sensitive nodes in the memory cell. In a bulk CMOS process, the capacitance is formed from a specific node to ground. As noted above, however, in the memory cell application of the present invention, because of the insulating substrate upon which the capacitor is formed, the capacitors are added between the output nodes of each inverter and their respective input nodes. In such a configuration, the capacitor across a respective inverter is able to quickly absorb positive charge from its positive channel MOSFET or negative charge from its associated negative channel MOSFET.

In a conventional MOS capacitor structure, the same large signal capacitance would have to be achieved with a respective capacitor of each polarity and each with its own respective occupation area. In contrast, the dual polarity capacitance structure of the present invention allows the memory cell to be made smaller than comparable CMOS processes to achieve the same tolerance to high energy particles.

DETAILED DESCRIPTION

As pointed out briefly above, the MOS capacitor structure in accordance with the present invention successfully addresses the depletion layer depth and semiconductor real estate occupation area shortcomings of conventional MOS capacitor structures by augmenting the lightly doped, lower silicon plate layer of the MOS capacitor structure with a pair of auxiliary, opposite conductivity type, (P+ and N+) high impurity concentration regions. Both of the auxiliary regions are formed such that they are directly contiguous with the lower plate silicon layer that underlies the capacitor's surface oxide. The auxiliary regions are connected to a common capacitor electrode terminal for the lower plate of the capacitor.

With this structure, if a high negative charge is applied to the top plate (gate electrode) overlying the capacitor's thin dielectric layer, holes are readily supplied by the auxiliary P+ region. If a high positive charge is applied to the gate electrode, electrons are readily supplied by the auxiliary N+ region. By connecting both auxiliary N+ and P+ regions together, a deep depletion condition is prevented for either polarity of the applied voltage. Moreover, since both auxiliary P+ and N+ contacts are tied together, there is no tendency of an inversion layer to float, which occurs in a conventional MOS capacitor structure, since the deep depletion layer forms a barrier between the inversion layer and a capacitor contact.

Figure 1:
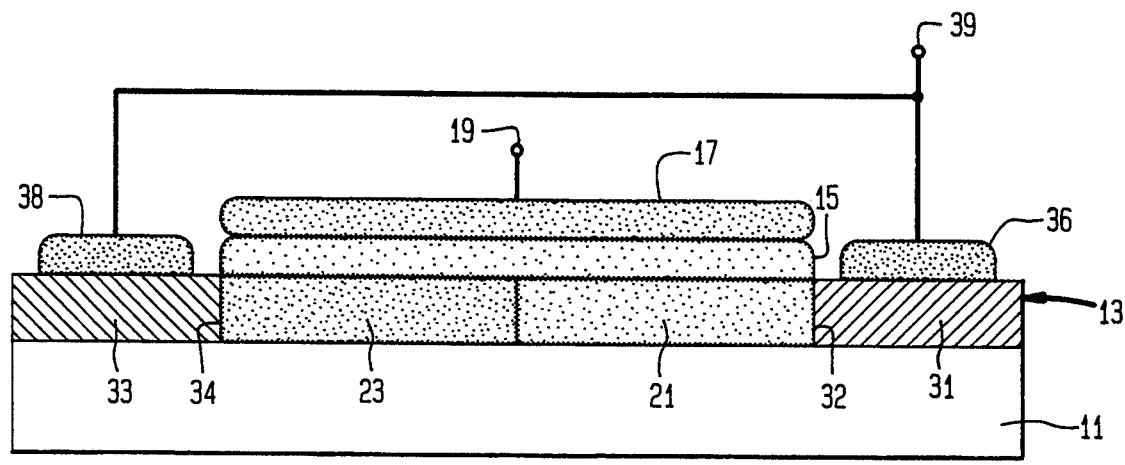
FIG. 1 diagrammatically illustrates a sectional view of a silicon-on--sapphire capacitor MOS capacitor architecture in accordance with a first embodiment of the present invention, in which a pair of auxiliary heavily doped contact regions are disposed at respective opposite end portions of the lower silicon plate layer of the capacitor.

A non-limitative example of an MOS capacitor architecture in accordance with a first embodiment of the present invention is diagrammatically illustrated in the cross-sectional view of FIG. 1 as comprising a silicon-on-sapphire structure having a support (sapphire) substrate 11, upon which a very thin (having a thickness on the order of from 1000 to 10,000 Angstroms) silicon layer 13 is formed (e.g. by liquid phase epitaxy). Although the illustrated example is an SOS architecture, other materials, such as a layer of insulator material (e.g. oxide) or semiconductor (e.g. silicon) may be employed for the support layer.

Disposed upon a first portion of thin semiconductor layer 13 is a thin insulator layer 15, which forms the dielectric field layer of the MOS capacitor. Insulator layer 15 may comprise a thin oxide layer having a thickness on the order of from 50–1000 Angstroms). Situated atop thin insulator layer 15 is layer 17 of conductive material, such as metal or (doped or undoped) polysilicon, which forms a first contact, top plate layer of the capacitor, to which a terminal 19 is connected. Directly underlying insulator layer 15, semiconductor layer 13 contains at least one lightly doped semiconductor region, shown in FIG. 1, as a first (P−) semiconductor region 21 and a second (N−) semiconductor region 23, so that a capacitor structure is formed by the top plate layer 17, thin oxide layer 15 and a lower plate layer comprised of lightly doped silicon, here a pair of lightly and oppositely doped regions 21 and 23. By 'lightly doped' is meant a concentration C such that $C*T_{ox}*Area$ (where $T_{ox}$ is the oxide thickness of layer 15) is small compared to, or on the order of, the total charge that needs to be absorbed. As an example, the impurity concentration of lightly doped regions may be in a range up to a concentration on the order of $10^{18}$ atoms/cm$^3$.

Semiconductor layer 13 further contains a first auxiliary (contact) semiconductor region 31 of a first (P+) conductivity type, having an impurity concentration on the order of $10^{20}$ atoms/cm$^3$, which is substantially higher than that of the lightly doped lower plate layer containing underlying regions 21 and 23. In the illustrated embodiment, the first (P+) contact semiconductor region 31 is directly contiguous with or contacts (P−) a first end 32 of lightly doped semiconductor region 21 of the capacitor's lower plate.

In the embodiment of the present example, the lower plate of the MOS capacitor is also directly contiguous with a second contact semiconductor region 33 of a second (N+) conductivity type having an impurity concentration higher than that of regions 21 and 23 and being directly contiguous with or contacting an end 34 of (N−) doped region 23, which is opposite to the end 32 of the lower plate contacted by first (P+) contact region 31. Formed on contact regions 31 and 33 are respective layers 36, 38 of conductive material (e.g. metal) which are connected together and provide a second (lower plate) terminal 39 for the capacitor.

Figure 2:
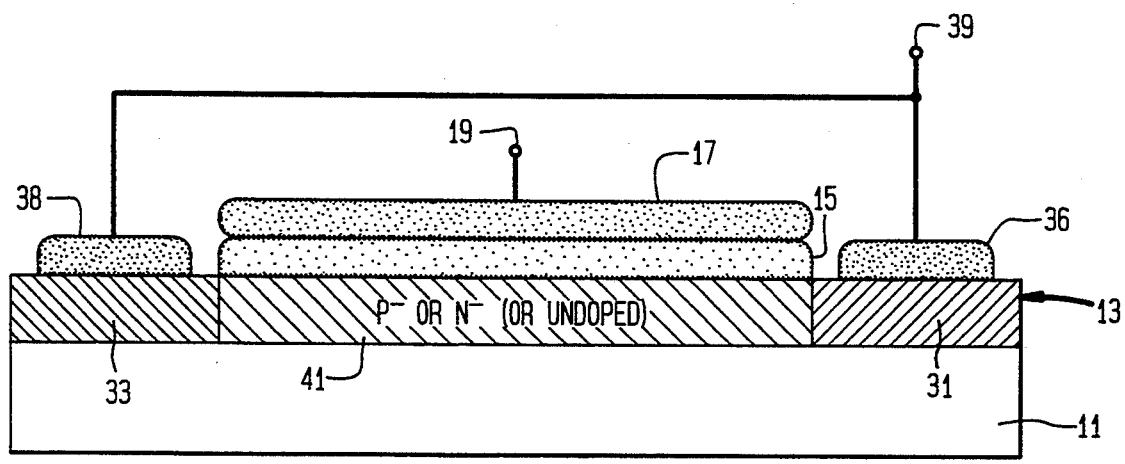
FIG. 2 diagrammatically illustrates a sectional view of a silicon-on-sapphire capacitor MOS capacitor architecture in accordance with a second embodiment of the present invention, in which the lower plate contains only a single lightly doped semiconductor region.
Figure 3:
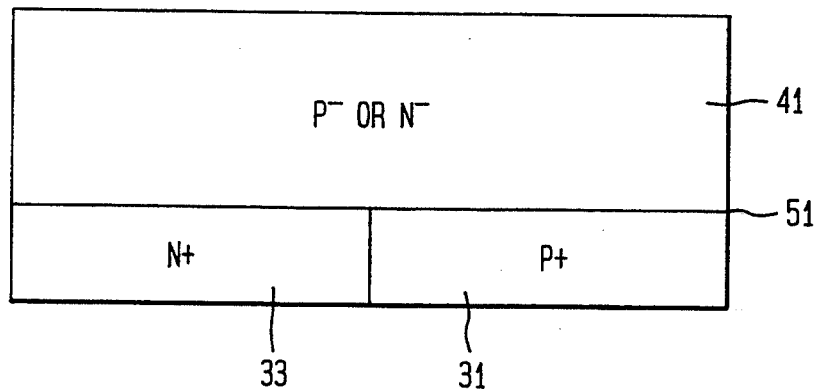
FIG. 3 diagrammatically illustrates a top view of a silicon-on-sapphire capacitor MOS capacitor architecture in accordance with a third embodiment of the present invention, in which a pair of auxiliary heavily doped contact regions are contiguous with a common side portion of the lower silicon plate layer of the capacitor.

As diagrammatically illustrated in FIG. 2, rather than employ a pair of lightly doped semiconductor regions (regions 21 and 23 in the illustrated embodiment) to form the lower plate of the MOS capacitor structure, the lower plate may contain only a single lightly doped semiconductor region 41 of a either P− or N− conductivity type. As another alternative structure, lightly doped lower plate may comprise more than two opposite conductivity type regions. What is important is that, regardless of the number or distribution of lightly portions that make up the lower plate of the MOS capacitor, contact to the lower plate is provided by way of opposite conductivity type, heavily doped regions, each of which is directly contiguous with the lower plate, such as at opposite ends of the lightly doped regions, as shown in FIG. 1, or contiguous with a common side portion 51 of the lower plate of the capacitor, as diagrammatically illustrated in the plan view of FIG. 3.

Figure 4:
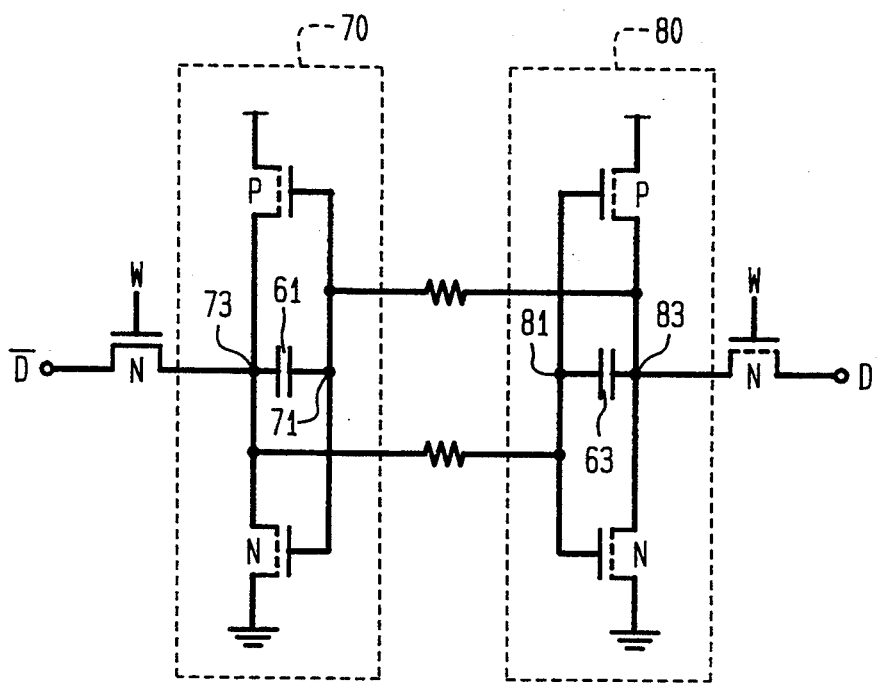
FIG. 4 shows a memory circuit structure employing a pair of MOS capacitors in accordance with the present invention coupled between the input and output nodes of respective inverters of a cross-coupled inverter pair.

As noted previously, one application of the improved MOS capacitor structure according to the present invention is its use in a single event upset (SEU) immune memory cell that is formed on an insulating substrate (for example, the sapphire substrate 11 of FIG. 1). In such a memory circuit structure, schematically illustrated in FIG. 4, a pair of MOS capacitors 61, 63, having a structural configuration in accordance with the present invention described above, are coupled between input and output nodes 71, 73 and 81, 83 of respective MOSFET inverters 70, 80 that comprise the memory cell's cross-coupled MOSFET inverter pair.

Should a high energy particle pass through the channel region of an off transistor of one of the inverters 70, 80, a large amount of charge is rapidly generated. Most of the charge is accumulated and swept across the 'OFF' MOS transistor's depletion region, which tends to change the voltage at the output of the inverter taking the hit. This voltage can change sufficiently to cause the other inverter of the cross-coupled MOSFET inverter pair of the memory cell to switch to its opposite state (from a '1' to a '0' or from a '0' to a '1').

The coupling of MOS capacitors 61, 63 configured in accordance with the present invention to include the auxiliary high impurity concentration regions that contact the lower lightly doped plate of the capacitor minimizes the effect of the particle hit, as each MOS capacitor that is connected across its associated inverter is able to quickly absorb positive charge from its positive channel MOSFET or negative charge from its associated negative channel MOSFET. As noted above, in a conventional MOS capacitor structure, the same large signal capacitance would have to be achieved with a respective capacitor of each polarity and each with its own respective occupation area.

As will be appreciated from the foregoing description, the depletion layer depth and semiconductor real estate occupation area shortcomings of conventional MOS capacitor architectures that are formed on lightly doped semiconductor material are effectively obviated in accordance with the present invention by augmenting the MOS capacitor structure with a pair of auxiliary, opposite conductivity type, (P+ and N+) high impurity concentration regions, both of which are directly contiguous with the lightly doped lower plate layer that underlies the capacitor's dielectric layer, and connecting both of these auxiliary heavily doped regions to a common capacitor electrode terminal for the lower plate of the capacitor. Should a high negative charge be applied to the upper plate overlying the thin dielectric layer, holes are readily supplied by the auxiliary P+ region. Conversely, if a high positive charge be applied to the upper plate, electrons are readily supplied by the auxiliary N+ region. By connecting both the auxiliary N+ and P+ regions together, a deep depletion condition is prevented for either polarity of the applied voltage. Moreover, since both P+ and N+ contacts are tied together, the tendency of an inversion layer to float (as occurs in a standard MOS capacitor, because the deep depletion layer forms a barrier between the inversion layer and a contact) is prevented. Further, the time required to charge the MOS capacitor is limited only by the mobility of the carriers in the thin epitaxial semiconductor layer in which the capacitor'a lower plate structure is formed.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A semiconductor capacitor device comprising:
   a semiconductor layer containing at least one semiconductor region, said at least one semiconductor region having at least one conductivity type;
   an insulator layer disposed upon said at least one semiconductor region of said semiconductor layer;
   a conductive layer disposed upon said insulator layer and providing a first contact for said capacitor device, so that a capacitor is formed between said conductive layer that is disposed atop said insulator layer and said at least one semiconductor region underlying said insulator layer;
   said semiconductor layer further containing a first contact semiconductor region of a first conductivity type and having an impurity concentration higher than that of said at least one semiconductor region, said first contact semiconductor region contacting a first portion of said at least one semiconductor region;
   said semiconductor layer further containing a second contact semiconductor region of a second conductivity type and having an impurity concentration higher than that of said at least one semiconductor region, said second contact semiconductor region contacting a second portion of said at least one semiconductor region; and
   conductive material contacting said first and second contact semiconductor regions and providing a second contact for said capacitor device.

2. A semiconductor capacitor device according to claim 1, wherein said semiconductor layer is disposed upon a support substrate which comprises insulator material.

3. A semiconductor capacitor device according to claim 1, wherein said semiconductor layer is disposed upon a support substrate which comprises sapphire.

4. A semiconductor capacitor device according to claim 1, wherein said semiconductor layer is disposed upon a support substrate which comprises semiconductor material.

5. A semiconductor capacitor device according to claim 1, wherein said at least one semiconductor region of said semiconductor layer contains a first semiconductor region of a first conductivity type and a second semiconductor region of a second conductivity type contiguous with said first semiconductor region, each of said first and second semiconductor regions having respective first and second impurity concentrations less than the impurity concentrations of said first and second contact regions and forming a plate of said semiconductor capacitor device.

6. A semiconductor capacitor device according to claim 1, wherein each of said first and second contact regions has a respective layer of conductive material disposed thereon, providing said second contact for said capacitor device.

7. A semiconductor capacitor device according to claim 1, wherein said at least one semiconductor region comprises a single semiconductor region of a first conductivity type having an impurity concentration less than the impurity concentrations of said first and second contact regions, and wherein said first contact semiconductor region contacts a first portion of said single semiconductor region, and wherein said second contact semiconductor region contacts a second portion of said single semiconductor region.

8. A semiconductor capacitor device according to claim 5, wherein said first contact semiconductor region contacts a first portion of said first semiconductor region, and wherein said second contact semiconductor region contacts a first portion of said second semiconductor region.

9. A semiconductor capacitor device according to claim 8, wherein said first portion of said first semiconductor region and said first portion of said second semiconductor region are disposed on a common side of said plate of said semiconductor capacitor device.

10. An MOS semiconductor capacitor structure comprising:
   a semiconductor layer containing conductivity type determining impurities;
   an insulator layer disposed upon said semiconductor layer and forming a dielectric layer of said MOS capacitor structure;
   a conductive layer disposed upon said insulator layer and providing a first plate of said MOS capacitor structure;
   a portion of said semiconductor layer containing conductivity type determining impurities underlying said insulator layer forming a second plate of said MOS capacitor structure;
   said semiconductor layer further containing a first contact semiconductor region of a first conductivity type and having an impurity concentration higher than that of said second plate portion of said semiconductor layer containing conductivity type determining impurities, said first contact semiconductor region contacting a first portion of said second plate portion of said semiconductor layer;
   said semiconductor layer further containing a second contact semiconductor region of a second conductivity type and having an impurity concentration higher than that of said second plate portion of said semiconductor layer, said second contact semiconductor region contacting a second portion of said second plate portion of said semiconductor layer; and
   conductive material contacting said first and second contact semiconductor regions and providing a second plate contact for said MOS capacitor structure.

11. An MOS semiconductor capacitor structure according to claim 10, wherein said semiconductor layer is disposed upon a support substrate which comprises insulator material.

12. An MOS semiconductor capacitor structure according to claim 10, wherein said semiconductor layer is disposed upon a support substrate which comprises sapphire.

13. An MOS semiconductor capacitor structure according to claim 10, wherein said semiconductor layer is disposed upon a support substrate which comprises semiconductor material.

14. An MOS semiconductor capacitor structure according to claim 10, wherein said second plate portion of said semiconductor layer contains a first semiconductor region of a first conductivity type and a second semiconductor region of a second conductivity type contiguous with said first semiconductor region, each of said first and second semiconductor regions having respective first and second impurity concentrations less than the impurity concentrations of said first and second contact regions.

15. An MOS semiconductor capacitor structure according to claim 10, wherein each of said first and second contact regions has a respective layer of conductive material disposed thereon.

16. An MOS semiconductor capacitor structure according to claim 10, wherein said second plate portion of said semiconductor layer comprises a single semiconductor region of a first conductivity type having an impurity concentration less than the impurity concentrations of said first and second contact regions, and wherein said first contact semiconductor region contacts a first portion of said single semiconductor region, and wherein said second contact semiconductor region contacts a second portion of said single semiconductor region.

17. An MOS semiconductor capacitor structure according to claim 14, wherein said first contact semiconductor region contacts a first portion of said first semiconductor region, and wherein said second contact semiconductor region contacts a first portion of said second semiconductor region.

18. An MOS semiconductor capacitor structure according to claim 17, wherein said first portion of said first semiconductor region and said first portion of said second semiconductor region are disposed on a common side of said second plate portion of said semiconductor layer.

19. An MOS semiconductor capacitor structure according to claim 17, wherein said first portion of said first semiconductor region and said first portion of said second semiconductor region are disposed on opposite ends of said second plate portion of said semiconductor layer.

20. An MOS semiconductor capacitor structure according to claim 16, wherein said first and second portions of said single semiconductor region are disposed on a common side of said second plate portion of said semiconductor layer.

21. An MOS semiconductor capacitor structure according to claim 16, wherein said first and second portions of said single semiconductor region are disposed on opposite ends of said second plate portion of said semiconductor layer.

22. An MOS memory cell structure comprising:
   a semiconductor layer containing a pair of cross-coupled MOSFET inverters having respective input and output nodes;
   a first MOS capacitor coupled between the input and output nodes of a first inverter of said pair of cross-coupled MOSFET inverters; and
   a second MOS capacitor coupled between the input and output nodes of a second inverter of said pair of cross-coupled MOSFET inverters; and wherein each of said first and second MOS semiconductor capacitor structures comprises
   a respective portion of said semiconductor layer containing conductivity type determining impurities,
   an insulator layer disposed upon said respective portion of said semiconductor layer and forming a dielectric layer of each MOS capacitor structure,
   a conductive layer disposed upon said insulator layer and providing a first plate of said each MOS capacitor structure,
   said respective portion of said semiconductor layer containing conductivity type determining impurities underlying said insulator layer forming a second plate of said each MOS capacitor structure, said semiconductor layer further containing a first contact semiconductor region of a first conductivity type and having an impurity concentration higher than that of said second plate portion of said semiconductor layer containing conductivity type determining impurities, said first contact semiconductor region contacting a first portion of said second plate portion of said semiconductor layer, said semiconductor layer further containing a second contact semiconductor region of a second conductivity type and having an impurity concentration higher than that of said second plate portion of said semiconductor layer, said second contact semiconductor region contacting a second portion of said second plate portion of said semiconductor layer, and conductive material contacting said first and second contact semiconductor regions and providing a second plate contact for said each MOS capacitor structure.

23. An MOS memory cell structure according to claim 22, wherein said semiconductor layer is disposed upon a substrate which comprises insulator material.

24. An MOS memory cell structure according to claim 22, wherein said semiconductor layer is disposed upon a substrate which comprises sapphire.

25. An MOS memory cell structure according to claim 22, wherein said semiconductor layer is disposed upon a substrate which comprises semiconductor material.

26. An MOS memory cell structure according to claim 22, wherein said second plate portion of said semiconductor layer contains a first semiconductor region of a first conductivity type and a second semiconductor region of a second conductivity type contiguous with said first semiconductor region, each of said first and second semiconductor regions having respective first and second impurity concentrations less than the impurity concentrations of said first and second contact regions.

27. An MOS memory cell structure according to claim 22, wherein said second plate portion of said semiconductor layer comprises a single semiconductor region of a first conductivity type having an impurity concentration less than the impurity concentrations of said first and second contact regions, and wherein said first contact semiconductor region contacts a first portion of said single semiconductor region, and wherein said second contact semiconductor region contacts a second portion of said single semiconductor region.

28. An MOS memory cell structure according to claim 26, wherein said first contact semiconductor region contacts a first portion of said first semiconductor region, and wherein said second contact semiconductor region contacts a first portion of said second semiconductor region.

29. An MOS memory cell structure according to claim 26, wherein said first portion of said first semiconductor region and said first portion of said second semiconductor region are disposed on a common side of said second plate portion of said semiconductor layer.

30. An MOS memory cell structure according to claim 26, wherein said first portion of said first semiconductor region and said first portion of said second semiconductor region are disposed on opposite ends of said second plate portion of said semiconductor layer.

31. An MOS memory cell structure according to claim 27, wherein said first and second portions of said single semiconductor region are disposed on a common side of said second plate portion of said semiconductor layer.

32. An MOS memory cell structure according to claim 27, wherein said first and second portions of said single semiconductor region are disposed on opposite ends of said second plate portion of said semiconductor layer.

* * * * *